(12) United States Patent
Goshima (10) Patent No.: US 6,316,731 B1
(45) Date of Patent: Nov. 13, 2001

(54) METHOD OF FORMING A PRINTED WIRING BOARD WITH COMPENSATION SCALES

(75) Inventor: Tsutomu Goshima, Toyama (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/442,382

(22) Filed: Nov. 17, 1999

(30) Foreign Application Priority Data

Nov. 17, 1998 (JP) .................................................. 10-326553

(51) Int. Cl.$^7$ ...................................................... H05K 1/00
(52) U.S. Cl. .......................... 174/250; 174/254; 174/262; 174/265; 361/748; 361/749; 361/802
(58) Field of Search ............................... 174/250, 262, 174/254, 265, 258, 260, 256, 259, 257, 261, 264; 361/748, 749, 756, 741, 802, 747, 759, 774, 776

(56) References Cited

U.S. PATENT DOCUMENTS 4,926,546 * 5/1990 Polczynski et al. ................... 29/840
6,201,193 * 3/2001 Hashimoto .......................... 174/260
6,232,559 * 5/2001 Janecek ............................. 174/255

FOREIGN PATENT DOCUMENTS

06302925 * 10/1994 (JP) .
2000036646 * 2/2000 (JP) .

* cited by examiner

Primary Examiner—Jeffrey Gaffin
Assistant Examiner—I B Patel
(74) Attorney, Agent, or Firm—Scully, Scott, Murphy & Presser (57) ABSTRACT

The present invention provides a printed wiring board formed with a film thereon, wherein the printed wiring board has at least a first reference mark and at least a first scale mark separated from the first reference mark, and the film has at least a second reference mark and at least a second scale mark separated from the second reference mark, and the second scale is positioned to overlap the first scale, and the first scale mark has a first scale and the second scale mark has a second scale which is so different from the first scale as to allow measuring a necessary amount of compensation in alignment to the film with reference to the printed wiring board.

22 Claims, 10 Drawing Sheets

METHOD OF FORMING A PRINTED WIRING BOARD WITH COMPENSATION SCALES

BACKGROUND OF THE INVENTION

The present invention relates to a method of forming a printed wiring board, and more particularly to an improved printed wiring board with a compensation scale.

For forming the printed wiring board, it is important to secure an alignment in position between through holes or via holes and a circuit pattern as well as an alignment in position between the through holes or via holes and a solder resist pattern. If no alignment is obtained, any disconnection between the through hole and the circuit pattern is caused, or a solder resist enters into the through hole thereby preventing the soldering with the through hole. The circuit pattern or the through hole may be stripped, which have to be coated with the solder resist.

Figure 1:
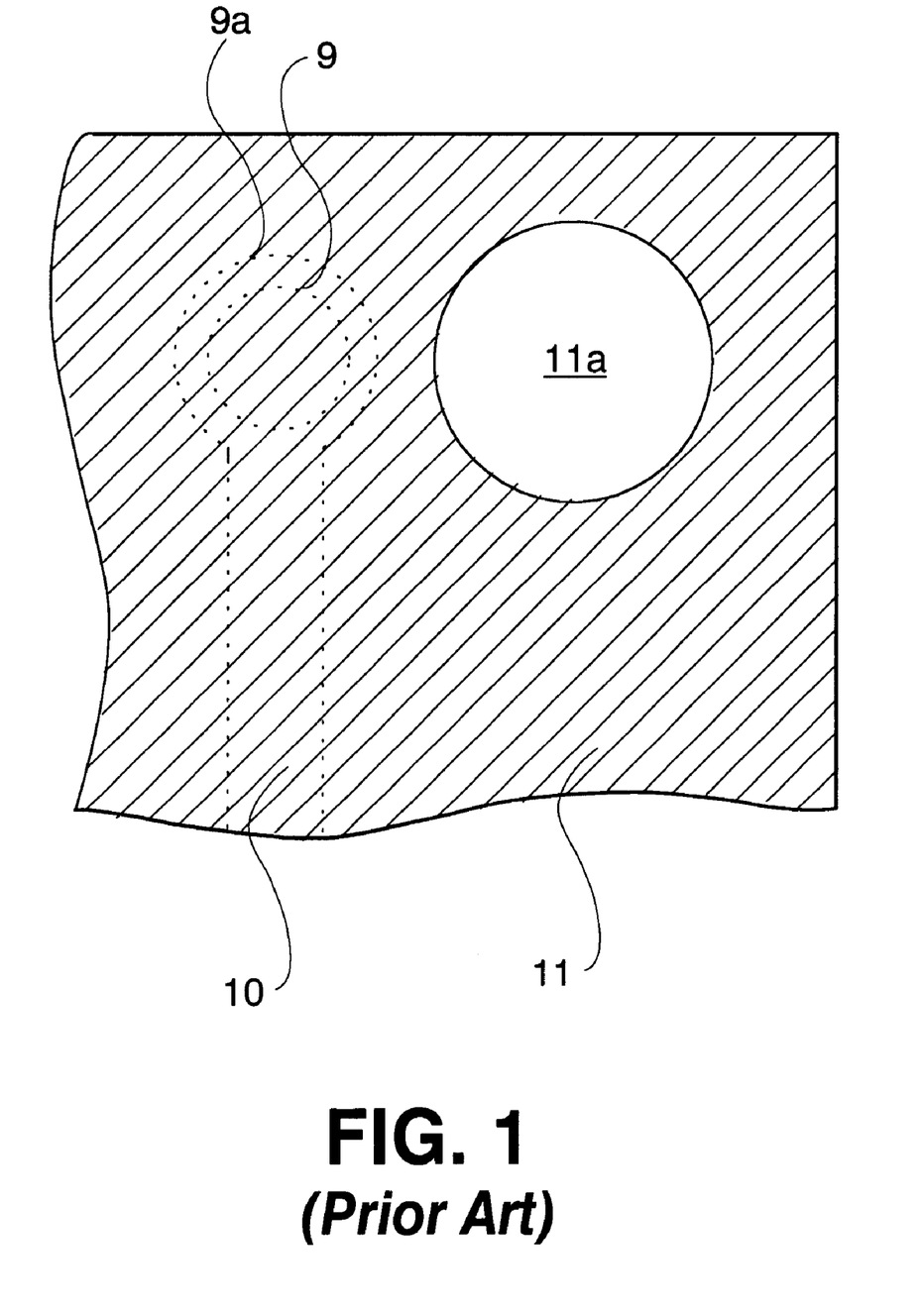
FIG. 1 is a fragmentary plane view illustrative of a printed wiring board with a circuit pattern having a through hole coated with a solder resist.

FIG. 1 is a fragmentary plane view illustrative of a printed wiring board with a circuit pattern having a through hole coated with a solder resist. The printed wiring board has a circuit pattern 10 connected with a circular shaped land 9a which defines a through hole 9. A solder resist 11 is provided which coats the surface of the printed wiring board. The solder resist 11 has an opening 11a which is positioned over a part of the printed circuit board which is different in position from the through hole 9, even the opening 11a should have to be positioned just over the through hole 9. This misalignment between the solder resist film and the pattern film appears, whereby it is impossible to conduct a soldering process in an assembly process for assembling the printed wiring board.

Figure 2:
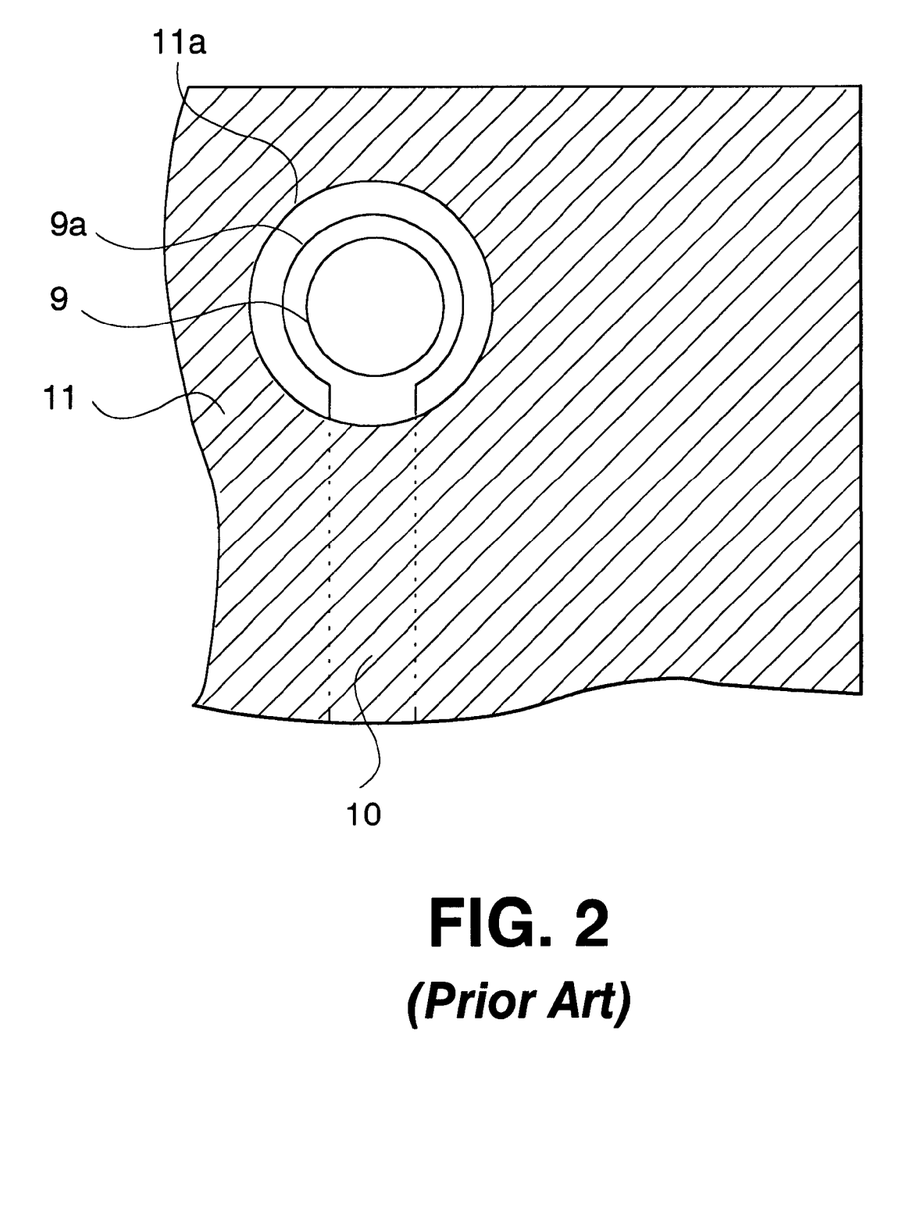
FIG. 2 is a fragmentary plane view illustrative of a printed wiring board with a circuit pattern having a through hole which is not coated with a solder resist.

FIG. 2 is a fragmentary plane view illustrative of a printed wiring board with a circuit pattern having a through hole which is not coated with a solder resist. The printed wiring board has a circuit pattern 10 connected with a circular shaped land 9a which defines a through hole 9. A solder resist 11 is provided which coats the surface of the printed wiring board. The solder resist 11 has an opening 11a which is positioned over the through hole 9. This perfect alignment between the solder resist film and the pattern film appears, whereby it is possible to conduct a soldering process in an assembly process for assembling the printed wiring board.

Accordingly, the perfect alignment of the through hole or the via hole and the circuit pattern and the solder resist is essential for forming the printed wiring board.

The circuit pattern is formed on the printed wiring board as follows. A photo-resist is coated over a copper foil. An exposure mask comprising a pattern film which has a circuit pattern is so positioned as to align a reference mark formed on the exposure mask to a through hole or a via hole. An exposure and a development are carried out to form an etching resist over the copper foil, so that a wet etching process is carried out by use of the etching resist to form a circuit pattern.

The solder resist is formed over the printed wiring board as follows. Similarly to the formation of the circuit pattern, a photo-resist is provided which coats the printed wiring board. Subsequently, a solder resist film as an exposure mask for the purpose of forming a solder resist is positioned so as to align a reference mark formed on the solder resist film to a mark formed on the printed wiring board for carrying out an exposure process and a subsequent development process thereby forming a solder resist pattern on the printed wiring board.

The alignments of the mask films for forming the circuit pattern and the solder resist are carried out with reference to the reference marks formed on the films by human eyes. However, the recent increase in high density of the printed wiring board and the high accuracy thereof make it difficult to obtain a perfect alignment with the human eyes.

In prior art techniques, there is a further problem in misalignment between the circuit pattern or the solder resist and the through hole or via hole. The printed wiring board receives a mechanical stress during processes for forming the same and also receive a thermal stress, whereby the printed wiring board may be strained. This strain causes misalignment of the mask film for the exposure process. In order to prevent the misalignment, it is required to compensate the exposure mask film for the circuit pattern and the solder resist pattern in accordance with the strain of the printed wiring board due to the received mechanical and thermal stresses. If the mask film receives a mechanical or thermal stress and then is strained, it is also required to the exposure mask film in accordance with the strain of the exposure mask film.

Figure 3:
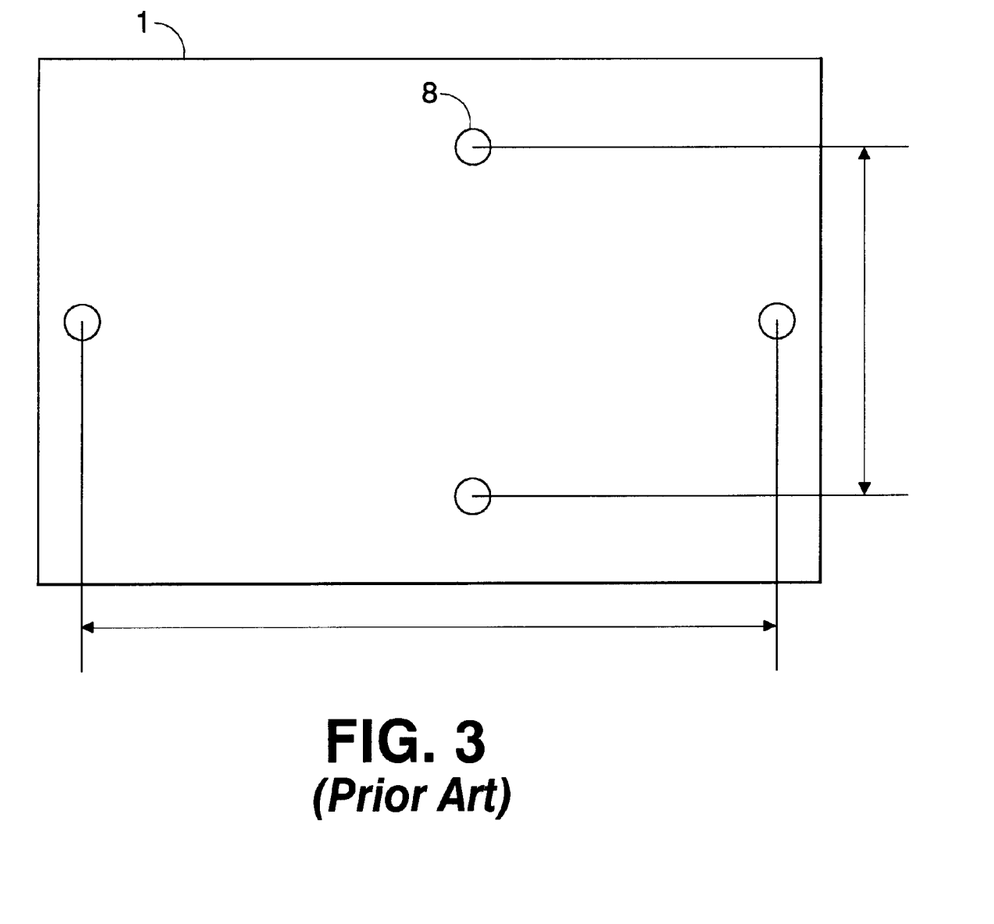
FIG. 3 is a plane view illustrative of a printed wiring board which has reference holes for calculating an amount of strain caused by received mechanical and/or thermal stresses.

FIG. 3 is a plane view illustrative of a printed wiring board which has reference holes for calculating an amount of strain caused by received mechanical and/or thermal stresses. The printed wiring board 1 has four reference holes 8 at intermediate positions of every four sides of the board 1, so that a distance between two of the reference holes 8 positioned in opposite sides is measured to calculate the strain. The exposure mask is formed with compensation made in accordance with the calculated amount of strain. The mask film is used for the exposure process to form the circuit pattern or the solder resist pattern.

The compensation is thus made on the basis of a variation in distance between the reference holes formed on the printed wiring board. In this case, it is required to measure every times variations in distances between the reference holes of the printed wiring board for calculating the amount of strain of the printed wiring board and calculating a necessary amount of the compensation in alignment. Those processes increase a total number of fabrication processes of the printed wiring board. Those increase in the number of the manufacturing processes also results in increase in the manufacturing cost. In order to prevent the increase in the number of the manufacturing processes and the increase in the manufacturing cost, it is required to hesitate to carry out the measurement of the distance between the reference holes unless the exposure film alignment is unobtainable.

A technique for improvement in measurement of the strain of the printed wiring board on off-line is disclosed in Japanese laid-open patent publication No. 60-249385. Main alignment marks are provided on intermediate positions on each four sides of the printed wiring board and subordinate alignment marks are provided on four corners of the printed wiring board.

This technique is effective to align the pattern film and the solder resist film, but ineffective to align between the through hole or via hole and the circuit pattern or the solder resist pattern, for which reason the above technique is insufficient for responding to the requirements for compensations to the strain caused by the mechanical and/or thermal stress.

As a further conventional technique, it is disclosed in Japanese laid-open patent publication No. 6-177505 that positioning pilot holes are formed at the same time when the through holes are formed in the printed wiring board.

As a further more conventional technique, it is disclosed in Japanese laid-open patent publication No. 60-249385 that both main scales and subordinate scales as alignment marks are formed on a film over the printed wiring board. Since both main scales and subordinate scales as alignment marks are formed on the film, then it is impossible to make a highly accurate compensation in alignment between a through hole or a via hole and a circuit pattern film or a solder resist film on the basis of a strain caused by mechanical and/or thermal stresses that at least any one of the printed wiring board and either the circuit pattern film or the solder resist film has received.

The through holes or via holes have been formed before the circuit pattern or the solder resist pattern is formed with reference to the positions of the through holes or via holes with compensation to strain of at least any one of the printed wiring board and the exposure film.

In the above circumstances, it had been required to develop a novel method of forming a printed wiring board free from the above problem.

SUMMARY OF THE INVENTION

Accordingly, it is an object of the present invention to provide a novel method of forming a printed wiring board free from the above problems.

It is a further object of the present invention to provide a novel method of forming a printed wiring board capable of an alignment between a circuit pattern film and a solder resist film.

It is a still further object of the present invention to provide a novel method of forming a printed wiring board capable of a highly accurate compensation in alignment between a through hole or a via hole and a circuit pattern film or a solder resist film on the basis of a strain caused by mechanical and/or thermal stresses that at least any one of the printed wiring board and either the circuit pattern film or the solder resist film has received.

It is yet a further object of the present invention to provide a novel method of measuring a necessary amount of compensation in alignment between a through hole or a via hole and a circuit pattern film or a solder resist film.

The first present invention provides a printed wiring board formed with a film thereon, wherein the printed wiring board has at least a first reference mark and at least a first scale mark separated from the first reference mark, and the film has at least a second reference mark and at least a second scale mark separated from the second reference mark, and the second scale is positioned to overlap the first scale, and the first scale mark has a first scale and the second scale mark has a second scale which is so different from the first scale as to allow measuring a necessary amount of compensation in alignment to the film with reference to the printed wiring board.

The second present invention provides a compensation scale structure formed in a printed wiring board formed with a film thereon, the compensation scale structure comprising at least a first reference mark on the printed wiring board and at least a first scale mark separated from the first reference mark and formed on the printed wiling board; and at least a second reference mark formed on the film and at least a second scale mark separated from the second reference mark and formed on the film, wherein the second scale is positioned to overlap the first scale, and the first scale mark has a first scale and the second scale mark has a second scale which is so different from the first scale as to allow measuring a necessary amount of compensation in alignment to the film with reference to the printed wiring board.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

The first present invention provides a printed wiring board formed with a film thereon, wherein the printed wiring board has at least a first reference mark and at least a first scale mark separated from the first reference mark, and the film has at least a second reference mark and at least a second scale mark separated from the second reference mark, and the second scale is positioned to overlap the first scale, and the first scale mark has a first scale and the second scale mark has a second scale which is so different from the first scale as to allow measuring a necessary amount of compensation in alignment to the film with reference to the printed wiring board.

It is preferable that the second scale is wider than the first scale.

It is further preferable that the second scale is wider than the first scale by a product of a distance between the first reference mark and a reference point of the first scale mark and a predetermined compensation rate.

It is also preferable that the printed wiring board has a plurality of the first scale marks which have different directions from each other and the film has a plurality of the second scale marks which have different directions from each other and which are parallel to the directions of the first scale marks respectively.

It is further preferable that the printed wiring board has a plurality of the first reference marks comprising first line segments extending along adjacent two sides of the printed wiring board, and each of the first line segments is longer than a half length of corresponding side of the printed wiring board, and also the film has a plurality of the second reference marks comprising second line segments extending along adjacent two sides of the film, and each of the second line segments is also longer than a half length of corresponding side of the film.

It is further more preferable that the first scale marks comprise first short line segments which are shorter than the first reference marks, and each of the first scale marks is positioned on the printed wiring board at an intermediate point of its side opposite to a side along which corresponding one of the first reference marks extends, and the second scale marks comprise second short line segments which are shorter than the second reference marks, and each of the second scale marks is positioned on the film at an intermediate point of its side opposite to a side along which corresponding one of the second reference marks extends.

It is moreover preferable that the first short line segment of each of the first scale marks extends perpendicular to the first line segment of corresponding one of the first reference marks, and the second short line segment of each of the second scale marks extends perpendicular to the second line segment of corresponding one of the second reference marks.

It is still further preferable that the first short line segment of each of the first scale marks extends in a first oblique direction from a first direction along which the first line segment of corresponding one of the first reference marks extends, and the second short line segment of each of the second scale marks extends in a second oblique direction from a second direction along which the second line segment of corresponding one of the second reference marks extends.

It is also preferable that the printed wiring board has a plurality of the first reference marks comprising first line segments extending along two center axes perpendicular to each other of the printed wiring board, and each of the first line segments is longer than a half length of corresponding side of the printed wiring board, and also the film has a plurality of the second reference marks comprising second line segments extending along two center axes perpendicular to each other of the film, and each of the second line segments is also longer than a half length of corresponding side of the film.

It is further preferable that the first scale marks comprise first short line segments which are shorter than the first reference marks, and the first scale marks are positioned at four intermediate points of four sides of the printed wiring board, and the second scale marks comprise second short line segments which are shorter than the second reference marks, and the second scale marks are positioned at four intermediate points of four sides of the film.

It is still further preferable that the first short line segment of each of the first scale marks extends parallel to the first line segment of corresponding one of the first reference marks, and the second short line segment of each of the second scale marks extends parallel to the second line segment of corresponding one of the second reference marks.

The second present invention provides a compensation scale structure formed in a printed wiring board formed with a film thereon, the compensation scale structure comprising: at least a first reference mark on the printed wiring board and at least a first scale mark separated from the first reference mark and formed on the printed wiring board; and at least a second reference mark formed on the film and at least a second scale mark separated from the second reference mark and formed on the film, wherein the second scale is positioned to overlap the first scale, and the first scale mark has a first scale and the second scale mark has a second scale which is so different from the first scale as to allow measuring a necessary amount of compensation in alignment to the film with reference to the printed wiring board.

It is preferable that the second scale is wider than the first scale.

It is further preferable that the second scale is wider than the first scale by a product of a distance between the first reference mark and a reference point of the first scale mark and a predetermined compensation rate.

It is also preferable that the printed wiring board has a plurality of the first scale marks which have different directions from each other and the film has a plurality of the second scale marks which have different directions from each other and which are parallel to the directions of the first scale marks respectively.

It is further preferable that the printed wiring board has a plurality of the first reference marks comprising first line segments extending along adjacent two sides of the printed wiring board, and each of the first line segments is longer than a half length of corresponding side of the printed wiring board, and also the film has a plurality of the second reference marks comprising second line segments extending along adjacent two sides of the film, and each of the second line segments is also longer than a half length of corresponding side of the film.

It is still further preferable that the first scale marks comprise first short line segments which are shorter than the first reference marks, and each of the first scale marks is positioned on the printed wiring board at an intermediate point of its side opposite to a side along which corresponding one of the first reference marks extends, and the second scale marks comprise second short line segments which are shorter than the second reference marks, and each of the second scale marks is positioned on the film at an intermediate point of its side opposite to a side along which corresponding one of the second reference marks extends.

It is yet further preferable that the first short line segment of each the first scale marks extends perpendicular to the first line segment of corresponding one of the first reference marks, and the second short line segment of each of the second scale marks extends perpendicular to the second line segment of corresponding one of the second reference marks.

It is further more preferable that the first short line segment of each of the first scale marks extends in a first oblique direction from a first direction along which the first line segment of corresponding one of the first reference marks extends, and the second short line segment of each of the second scale marks extends in a second oblique direction from a second direction along which the second line segment of corresponding one of the second reference marks extends.

It is also preferable that the printed wiring board has a plurality of the first reference marks comprising first line segments extending along two center axes perpendicular to each other of the printed wiring board, and each of the first line segments is longer than a half length of corresponding side of the printed wiring board, and also the film has a plurality of the second reference marks comprising second line segments extending along two center axes perpendicular to each other of the film, and each of the second line segments is also longer than a half length of corresponding side of the film.

It is further preferable that the first scale marks comprise first short line segments which are shorter than the first reference marks, and the first scale marks are positioned at four intermediate points of four sides of the printed wiring board, and the second scale marks comprise second short line segments which are shorter than the second reference marks, and the second scale marks are positioned at four intermediate points of four sides of the film.

It is still further preferable that the first short line segment of each of the first scale marks extends parallel to the first line segment of corresponding one of the first reference marks, and the second short line segment of each of the second scale marks extends parallel to the second line segment of corresponding one of the second reference marks.

PREFERRED EMBODIMENT

Figure 4:
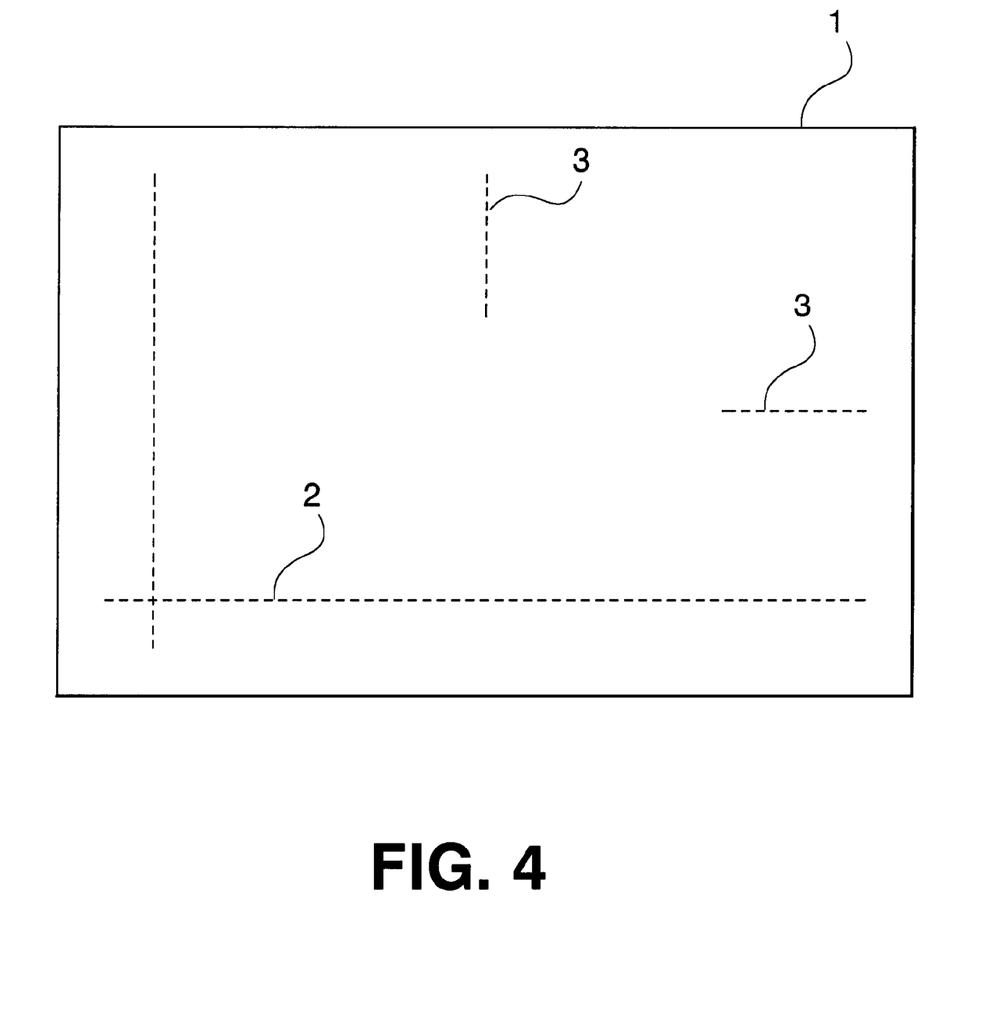
FIG. 4 is a plane view illustrative of a novel printed wiring board having two main reference mark straight lines extending along two adjacent sides of the printed wiring board and two main scale marks used in a first embodiment in accordance with the present invention.
Figure 5:
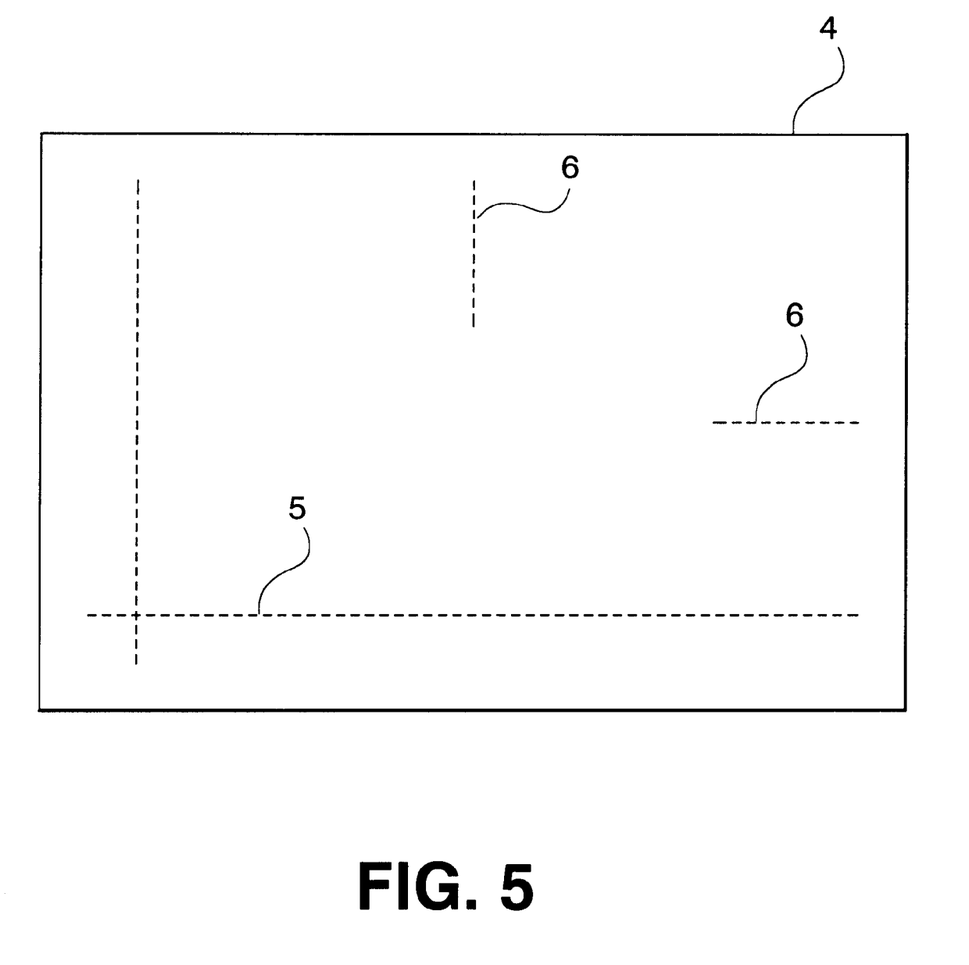
FIG. 5 is a plane view illustrative of a novel exposure film having two subordinate reference mark straight lines extending along two adjacent sides of the printed wiring board and two subordinate scale marks used in the first embodiment in accordance with the present invention.
Figure 6A:
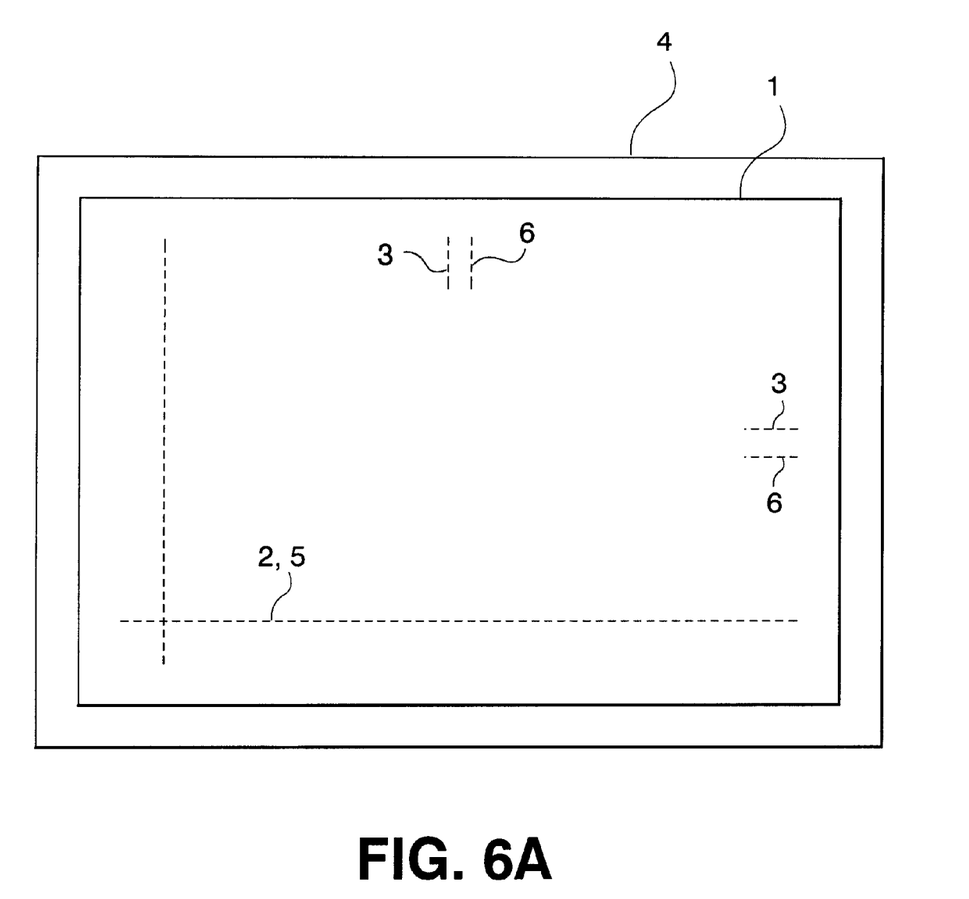
FIG. 6A is a plane view illustrative of the novel exposure film of FIG. 5 superimposed over the novel printed wiring board of FIG. 4.
Figure 7:
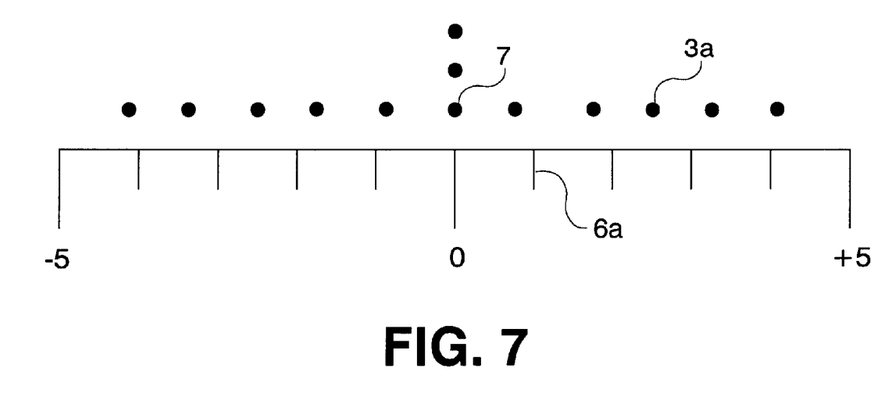
FIG. 7 is a diagram illustrative of the main scale of the novel printed wiring board of FIG. 4 and the subordinate scale of the novel exposure film of FIG. 5 in the process of alignment between them when the printed wiring board and the exposure film have no strains.
Figure 8:
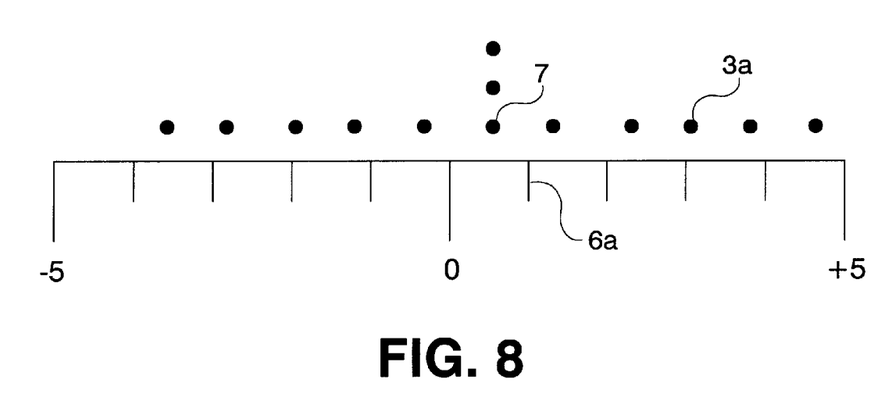
FIG. 8 is a diagram illustrative of the main scale of the novel printed wiring board of FIG. 4 and the subordinate scale of the novel exposure film of FIG. 5 in the process of alignment between them when the printed wiring board has a strain caused by thermal and/or mechanical stresses.

A first embodiment according to the present invention will be described in detail with reference to the drawings. FIG. 4 is a plane view illustrative of a novel printed wiring board having two main reference mark straight lines extending along two adjacent sides of the printed wiring board and two main scale marks used in a first embodiment in accordance with the present invention. FIG. 5 is a plane view illustrative of a novel exposure film having two subordinate reference mark straight lines extending along two adjacent sides of the printed wiring board and two subordinate scale marks used in the first embodiment in accordance with the present invention. FIG. 6A is a plane view illustrative of the novel exposure film of FIG. 5 superimposed over the novel printed wiring board of FIG. 4. FIG. 6E is a side view illustrative of the novel exposure film of FIG. 5 superimposed over the novel printed wiring board of FIG. 4 in the process of alignment between them. FIG. 7 is a diagram illustrative of the main scale of the novel printed wiring board of FIG. 4 and the subordinate scale of the novel exposure film of FIG. 5 in the process of alignment between them when the printed wiring board and the exposure film have no strains. FIG. 8 is a diagram illustrative of the main scale of the novel printed wiring board of FIG. 4 and the subordinate scale of the novel exposure film of FIG. S in the process of alignment between them when the printed wiring board has a strain caused by thermal and/or mechanical stresses.

With reference to FIG. 4, at the same time when the through hole or the via hole not illustrated is formed in the printed wiring board 1, the two main reference mark straight lines 2 and the main scale marks 3 are formed on a surface of the printed wiring board 1. The two main reference mark straight lines 2 extend along two adjacent sides of the printed wiring board 1, so that the two main reference mark straight lines 2 crosses with each other at one corner of the printed wiring board 1. The two main reference mark straight lines 2 extend in directions perpendicular to each other. The two main reference mark straight lines 2 are formed in a peripheral region of the printed wiring board 1. Further, the two main scale marks 3 are formed on the surface of the printed wiring board 1. The two main scale marks 3 are formed at intermediate positions of sides opposite to the sides along which the two main reference mark straight lines 2. First one of the two main scale marks 3 extends in a direction perpendicular to the main reference mark straight line 2 which extends along the side opposite to the side near which the first one of the two main scale marks 3 is positioned. The first one of the two main scale marks 3 thus extends in the direction parallel to the main reference mark straight line 2 which extends along the side adjacent to the side near which the first one of the two main scale marks 3 is positioned. Second one of the two main scale marks 3 extends in another direction perpendicular to the main reference mark straight line 2 which extends along the side opposite to the side near which the second one of the two main scale marks 3 is positioned. The second one of the two main scale marks 3 thus extends in the other direction parallel to the main reference mark straight line 2 which extends along the side adjacent to the side near which the second one of the two main scale marks 3 is positioned. The two main scale marks 3 are positioned at predetermined distances from the two main reference mark straight lines 2. Each of the two main reference mark straight lines 2 comprises a straight alignment of penetrating holes having a diameter of 50–100 micrometers, or non-penetrating holes having a diameter of 50–100 micrometers. Each of the two main scale marks 3 also comprises a straight alignment of penetrating holes having a diameter of 50–100 micrometers, or non-penetrating holes having a diameter of 50–100 micrometers.

A copper plate not illustrated is formed over the entire surface of the printed wiring board 1, wherein the copper plated foil has a thickness of 20–30 micrometers. A photo-resist is applied on the copper plate. An exposure film 4 as shown in FIG. 5 is provided on the photo-resist.

With reference to FIG. 5, at the same time when the through hole or the via hole not illustrated is formed in the exposure film 4, the two subordinate reference mark straight lines 5 and the subordinate scale marks 6 are formed on a surface of the exposure film 4. The two subordinate reference mark straight lines 5 extend along two adjacent sides of the exposure film 4, so that the two subordinate reference mark straight lines 5 crosses with each other at one corner of the exposure film 4. The two subordinate reference mark straight lines 5 extend in directions perpendicular to each other. The two subordinate reference mark straight lines 5 are formed in a peripheral region of the exposure film 4. Further, the two subordinate scale marks 6 are formed on the surface of the exposure film 4. The two subordinate scale marks 6 awe formed at intermediate positions of sides opposite to the sides along which the two subordinate reference mark straight lines 5. First one of the two subordinate scale marks 6 extends in a direction perpendicular to the subordinate reference mark straight line 5 which extends along the side opposite to the side near which the first one of the two subordinate scale marks 6 is positioned. The fist one of the two subordinate scale marks 6 thus extends in the direction parallel to the subordinate reference mark straight line 5 which extends along the side adjacent to the side near which the first one of the two subordinate scale marks 6 is positioned. Second one of the two subordinate scale marks 6 extends in another direction perpendicular to the subordinate reference mark straight line 5 which extends along the side opposite to the side near which the second one of the two subordinate scale marks 6 is positioned. The second one of the two subordinate scale marks 6 thus extends in the other direction parallel to the subordinate reference mark straight line 5 which extends along the side adjacent to the side near which the second one of the two subordinate scale marks 6 is positioned. The two subordinate scale marks 6 are positioned at predetermined distances from the two subordinate reference mark straight lines 5. Each of the two subordinate reference mark straight lines 5 comprises a straight line having a line width of 50–100 micrometers, or a straight alignment of penetrating or non-penetrating holes having a diameter of 50–100 micrometers. Each of the two subordinate scale marks 6 also comprises a straight line having a line width of 50–100 micrometers, or a straight alignment of penetrating or non-penetrating holes having a diameter of 50–100 micrometers. Accordingly, the subordinate reference mark straight lines 5 and the two subordinate scale marks 6 of the exposure film 4 are respectively formed at positions corresponding to the positions of the main subordinate reference mark straight lines 2 and the two subordinate scale marks 3 of the printed wiring board 1.

Figure 6B:
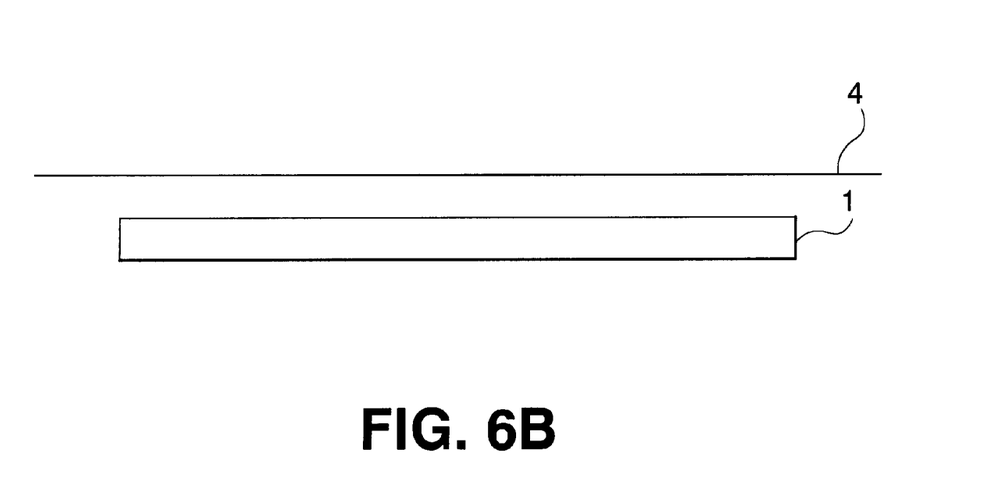
FIG. 6B is a side view illustrative of the novel exposure film of FIG. 5 superimposed over the novel printed wiring board of FIG. 4 in the process of alignment between them.

As shown in FIGS. 6A and 6B, the exposure film 4 is positioned so that the subordinate reference mark straight lines 5 of the exposure film 4 are aligned to the main subordinate reference mark straight lines 2 of the printed wiring board 1, whereby an amount of a strain of the printed wiring board 1 appears to be both a first displacement between the first one of the main scale marks 3 and the first one of the subordinate scale marks 6 and a second displacement between the second one of the main scale marks 3 and the second one of the subordinate scale marks 6. Namely, both the first and second displacements between the first and second ones of the main scale marks 3 and the subordinate scale marks 6 represents an amount of two dimensional strain of the printed wiring board 1. The alignment between the subordinate reference mark straight lines 5 to the main subordinate reference mark straight lines 2 may be made with human eyes. The first and second displacements between the first and second ones of the main scale marks 3 and the subordinate scale marks 6 may be confirmed with human eyes. The necessary amount of the compensation in position to the exposure film 4 can be found on the basis of the first and second displacements between the first and second ones of the main scale marks 3 and the subordinate scale marks 6.

As shown in FIG. 7, each of the main scale marks 3a is so provided that a reference point 7 of each of the main scale marks 3a is positioned at a first reference distance "A" from the main subordinate reference mark straight line 2 and also that scale points aligned in a straight line are symmetrically provided with reference to the reference point 7 at a predetermined first constant pitch in both plus and minus scale directions. On the other hand, each of the subordinate scale marks 6a is so provided that a zero point "0" thereof is positioned at a second reference distance "B" from the subordinate reference mark straight line 5 and also that a scale straight line is drawn symmetrically with reference to the zero point "0", wherein each subordinate scale marks are provided at a predetermined second constant pitch in both plus and minus scale directions. The predetermined second constant pitch of the subordinate scale lines 6a of the subordinate scale mark 6 is slightly wider than the above predetermined first constant pitch of the scale points 3a of the main scale mark 3 by a distance corresponding to one-point of the film compensation. The predetermined second constant pitch of the subordinate scale lines 6a of the subordinate scale mark 6 is, for example, defined to be a sum of both the first constant pitch of the scale points 3a and a product of the first reference distance "A" and a compensation rate which corresponds to one point of the film compensation. If the first constant pitch of the scale points 3a is 0.50 mm, the first reference distance "A" is 500 mm and the compensation rate is 0.01%, then the predetermined second constant pitch of the subordinate scale lines 6a is set to be 0.55 mm.

If a compensation to the exposure film with reference to the printed wiring board is highly accurate, the reference point 7 of the main scale mark 3 just corresponds to the zero point "0" of the subordinate scale mark 6 as shown in FIG. 7.

If, however, the compensation to the exposure film with reference to the printed wiring board is not highly accurate due to a strain of the printed wiring board 1, the reference point 7 of the main scale mark 3 is displaced from the zero point "0" of the subordinate scale mark 6 as shown in FIG. 8. In this case, the necessary amount of compensation to the exposure film 4 is given to be a minimum corresponding subordinate scale line 6a of the subordinate scale mark 6 which just corresponds to one of the scale points 3a of the main scale mark 3. FIG. 8 shows that the necessary amount of compensation is+2 points.

Accordingly, the above invention of the first embodiment allows that it is easily possible by human eyes to confirm a correspondence in alignment between the exposure film and the printed wiring board as well as possible to read the necessary amount of compensation in alignment to the exposure film even if the exposure film is misaligned to the printed wiring board due to a strain of the printed wiring board.

The subordinate reference mark straight lines 5 and the subordinate scale marks 6 remain over the printed wiring board as the record of printing process, for which reason it is possible to post-confirm the accuracy in alignment between the exposure film and the printed wiring board or in compensation to the exposure film with reference to the printed wiring board.

The above novel scale structure is applicable to when at least any one of the printed wiring board and the exposure film receives a strain due to a mechanical and/or thermal stress.

The above present invention described in this first embodiment is of course applicable to the alignment between the exposure film and the printed wiring board in case of forming the solder resist.

Figure 9:
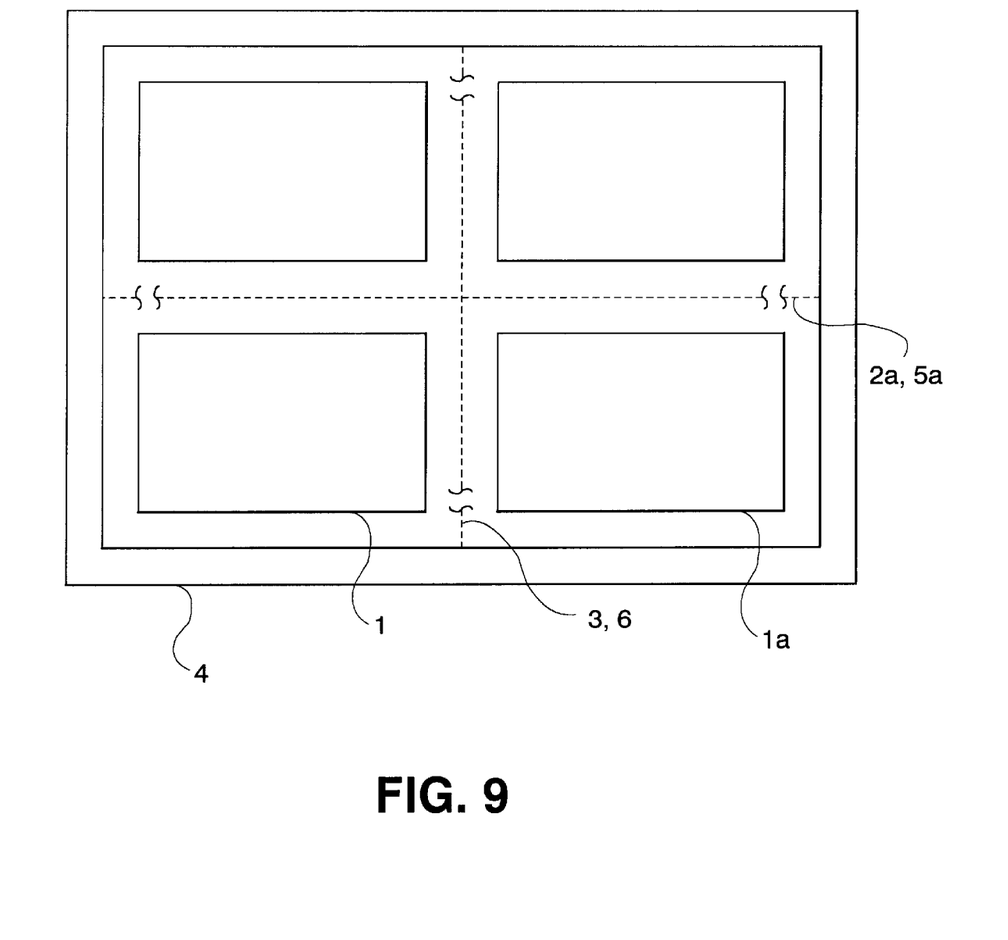
FIG. 9 is a plane view illustrative of a novel collective printed wiring board having four printed wiring boards and having a first set of two main reference mark straight lines and four main scale marks as well as an overlaying novel exposure film having a second set of two subordinate reference mark straight lines and four subordinate scale marks in a second embodiment in accordance with the present invention.

A second embodiment according to the present invention will be described in detail with reference to the drawings. The following descriptions will focus only on different matters from what are described in the above first embodiment. FIG. 9 is a plane view illustrative of a novel collective printed wiring board having four printed wiring boards and having a first set of two main reference mark straight lines and four main scale marks as well as an overlaying novel exposure film having a second set of two subordinate reference mark straight lines and four subordinate scale marks in a second embodiment in accordance with the present invention.

A collective printed wiring board 1a has four printed wiring boards 1 which are arranged in 2×2 matrix so as to separate individuals of the printed wiring boards 1 by first and second slender shaped isolation regions. The first slender shaped isolation region extends along a first center axis in a first direction of the collective printed wiring board 1a, whilst the second slender shaped isolation region extends along a second center axis in a second direction perpendicular to the first direction, so that the first and second slender shaped isolation regions form a cross-shaped isolation region which divide the collective printed wiring board 1a into subordinate four regions on which the four printed wiring boards 1 are provided.

The collective printed wiring board 1a has two main reference mark straight lines 2a, one of which extends along the first center axis in the first direction and in the first slender shaped isolation region, whilst another extends along the second center axis in the second direction and in the second slender shaped isolation region, so that the two main reference mark straight lines 2a form a cross shaped mark.

The collective printed wiring board 1a also has four main scale marks 3 which are positioned at individual intermediate positions of the four sides of the collective printed wiring board 1a. The four main scale marks 3 are aligned on the first and second center axes so that two of the four main scale marks 3 extend in parallel to one of the two main reference mark straight lines 2a whilst the remaining two of the four main scale marks 3 extend in parallel to another of the two main reference mark straight lines 2a.

Figure 10A:
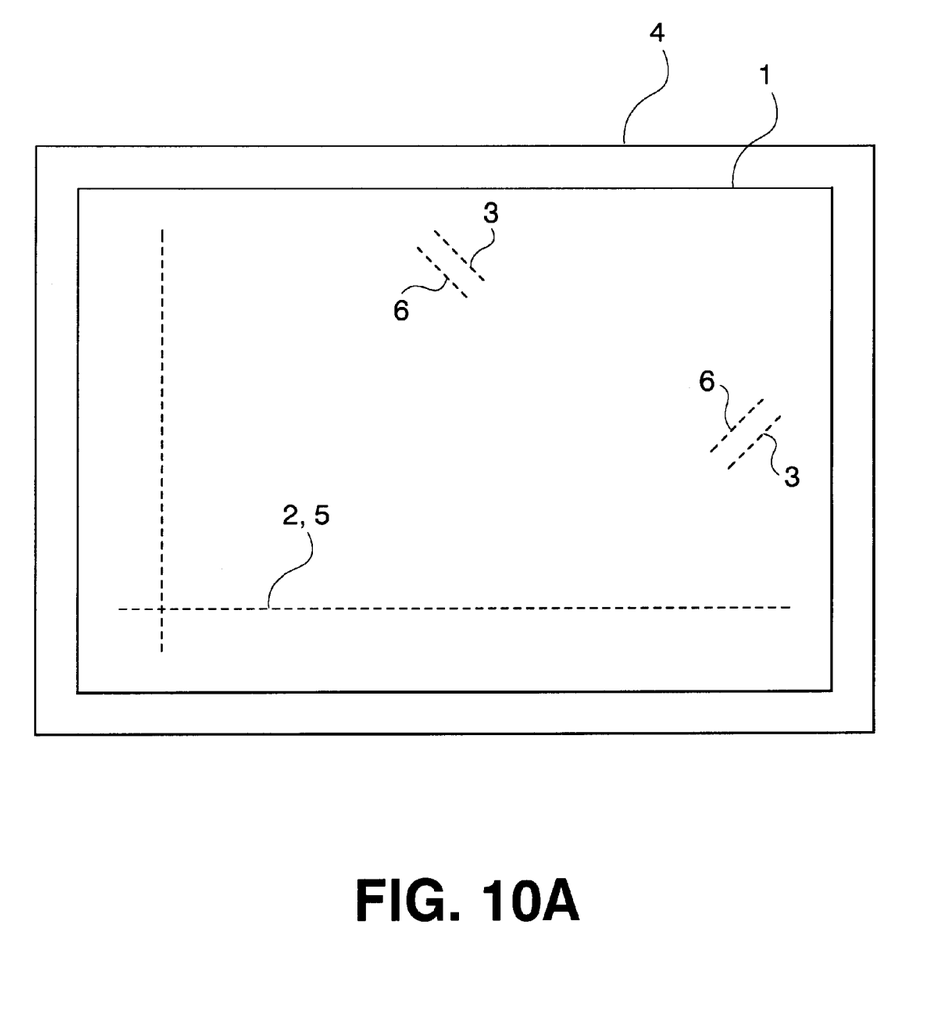
FIG. 10A is a plane view illustrative of a novel printed wiring board having a first set of two main reference mark straight lines and two main scale marks as well as an overlaying novel exposure film having a second set of two subordinate reference mark straight lines and two subordinate scale marks in a third embodiment in accordance with the present invention.
Figure 10B:
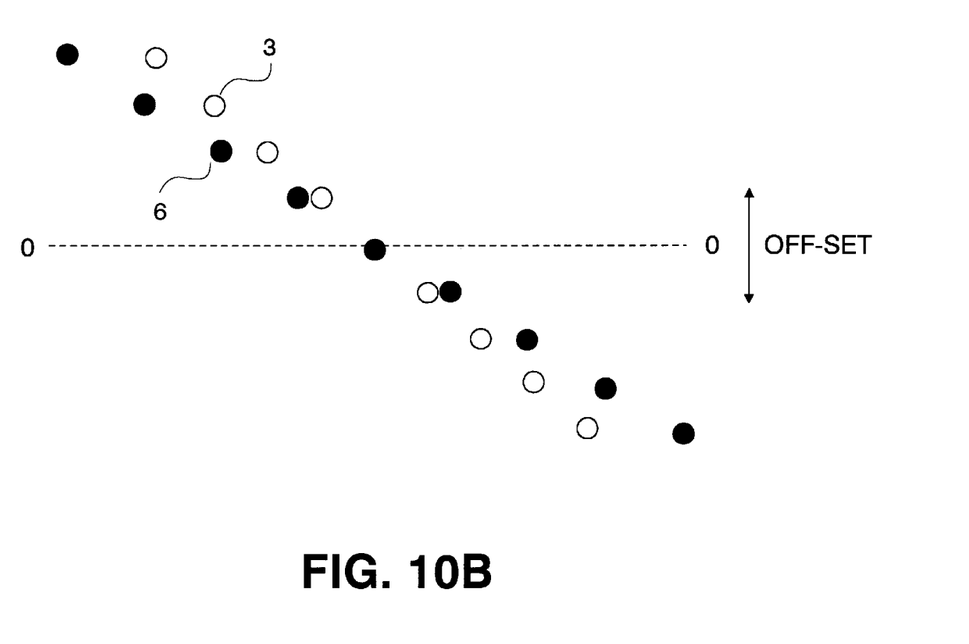
FIG. 10B is a diagram illustrative of the main scale of the novel printed wiring board and the subordinate scale of the novel exposure film of FIG. 10A in the process of alignment between them when the printed wiring board has no strain.

A third embodiment according to the present invention will be described in detail with reference to the drawings. The following descriptions will focus only on different matters from what are described in the above first embodiment. FIG. 10A is a plane view illustrative of a novel printed wiring board having a first set of two main reference mark straight lines and two main scale marks as well as an, overlaying novel exposure film having a second set of two subordinate reference mark straight lines and two subordinate scale marks in a third embodiment in accordance with the present invention. FIG. 10B is a diagram illustrative of the main scale of the novel printed wiring board and the subordinate scale of the novel exposure film of FIG. 10A in the process of alignment between them when the printed wiring board has no strain.

The main scale marks 3 and the subordinate scale marks 6 extend in directions tilted by predetermined included angles of more than 0 degree and less than 90 degrees from the first and second directions along which the main and subordinate reference mark straight lines 2 and 5. As shown in FIG. 10B, the main scale points of the main scale mark 3 are proportionally off-set in position in a direction perpendicular to the scale direction along which the main reference mark straight line 2 extends in the opposite side to the side of the main scale points of the main scale mark 3, so that the main scale points of the main scale mark 3 form a straight line extending in an oblique direction from the scale direction. In this case, it is possible to form the main scale mark 3 and the subordinate scale mark 6 either separately from each other or to be exactly overlapped with each other. If the main scale mark 3 and the subordinate scale mark 6 are formed to be exactly overlapped with each other, then it is possible to reduce a dummy region which is unusable for the product.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A printed wiring board formed with a film thereon, wherein said printed wiring board has at least a first reference mark and at least a first scale mark separated from said first reference mark, and said film has at least a second reference mark and at least a second scale mark separated from said second reference mark, and said second scale is positioned to overlap said first scale, and said first scale mark has a first scale and said second scale mark has a second scale which is so different from said first scale as to allow measuring a necessary amount of compensation in alignment to said film with reference to said printed Wiring board.

2. The printed wiring board as claimed in claim 1, wherein said second scale is wider than said first scale.

3. The printed wiring board as claimed in claim 2, wherein said second scale is wider than said first scale by a product of a distance between said first reference mark and a reference point of said first scale mark and a predetermined compensation rate.

4. The printed wiring board as claimed in claim 1, wherein said printed wiring board has a plurality of said first scale marks which have different directions from each other and said film has a plurality of said second scale marks which have different directions from each other and which are parallel to said directions of said first scale marks respectively.

5. The printed wiring board as claimed in claim 4, wherein said printed wiring board has a plurality of said first reference marks comprising first line segments extending along adjacent two sides of said printed wiring board, and each of said first line segments is longer than a half length of corresponding side of said printed wiring board, and also said film has a plurality of said second reference marks comprising second line segments extending along adjacent two sides of said film, and each of said second line segments is also longer than a half length of corresponding side of said film.

6. The printed wiring board as claimed in claim 5, wherein said first scale marks comprise first short line segments which are shorter than said first reference marks, and each of said first scale marks is positioned on said printed wiring board at an intermediate point of its side opposite to a side along which corresponding one of said first reference marks extends, and said second scale marks comprise second short line segments which are shorter than said second reference marks, and each of said second scale marks is positioned on said film at an intermediate point of its side opposite to a side along which corresponding one of said second reference marks extends.

7. The printed wiring board as claimed in claim 6, wherein said first short line segment of each of said first scale marks extends perpendicular to said first line segment of corresponding one of said first reference marks, and said second short line segment of each of said second scale marks extends perpendicular to said second line segment of corresponding one of said second reference marks.

8. The printed wiring board as claimed in claim 6, wherein said first short line segment of each of said first scale marks extends in a first oblique direction from a first direction along which said first line segment of corresponding one of said first reference marks extends, and said second short line segment of each of said second scale marks extends in a second oblique direction from a second direction along which said second line segment of corresponding one of said second reference marks extends.

9. The printed wiring board as claimed in claim 4, wherein said printed wiring board has a plurality of said first reference marks comprising first line segments extending along two center axes perpendicular to each other of said printed wiring board, and each of said first line segments is longer than a half length of corresponding side of said printed wiring board, and also said film has a plurality of said second reference marks comprising second line segments extending along two center axes perpendicular to each other of said film, and each of said second line segments is also longer than a half length of corresponding side of said film.

10. The printed wiring board as claimed in claim 9, wherein said first scale marks comprise first short line segments which are shorter than said first reference marks, and said first scale marks are positioned at four intermediate points of four sides of said printed wiring board, and said second scale marks comprise second short line segments which are shorter than said second reference marks, and said second scale marks are positioned at four intermediate points of four sides of said film.

11. The printed wiring board as claimed in claim 10, wherein said first short line segment of each of said first scale marks extends parallel to said first line segment of corresponding one of said first reference marks, and said second short line segment of each of said second scale marks extends parallel to said second line segment of corresponding one of said second reference marks.

12. A compensation scale structure formed in a printed wiring board formed with a film thereon, said compensation scale structure comprising:

at least a first reference mark on said printed wiring board and at least a first scale mark separated from said first reference mark and formed on said printed wiring board; and at least a second reference mark formed on said film and at least a second scale mark separated from said second reference mark and formed on said film, wherein said second scale is positioned to overlap said first scale, and said first scale mark has a first scale and said second scale mark has a second scale which is so different from said first scale as to allow measuring a necessary amount of compensation in alignment to said film with reference to said printed wiring board.

13. The compensation scale structure as claimed in claim 12, wherein said second scale is wider than said first scale.

14. The compensation scale structure as claimed in claim 13, wherein said second scale is wider than said first scale by a product of a distance between said first reference mark and a reference point of said first scale mark and a predetermined compensation rate.

15. The compensation scale structure as claimed in claim 12, wherein said printed wiring board has a plurality of said first scale marks which have different directions from each other and said film has a plurality of said second scale marks which have different directions from each other and which are parallel to said directions of said first scale marks respectively.

16. The compensation scale structure as claimed in claim 15, wherein said printed wiring board has a plurality of said first reference marks comprising first line segments extending along adjacent two sides of said printed wiring board, and each of said first line segments is longer than a half length of corresponding side of said printed wiring board, and also said film has a plurality of said second reference marks comprising second line segments extending along adjacent two sides of said film, and each of said second line segments is also longer than a half length of corresponding side of said film.

17. The compensation scale structure as claimed in claim 16, wherein said first scale marks comprise first short line segments which are shorter than said first reference marks, and each of said first scale marks is positioned on said printed wiring board at an intermediate point of its side opposite to a side along which corresponding one of said first reference marks extends, and said second scale marks comprise second short line segments which are shorter than said second reference marks, and each of said second scale marks is positioned on said film at an intermediate point of its side opposite to a side along which corresponding one of said second reference marks extends.

18. The compensation scale structure as claimed in claim 17, wherein said first short line segment of each of said first scale marks extends perpendicular to said first line segment of corresponding one of said first reference marks, and said second short line segment of each of said second scale marks extends perpendicular to said second line segment of corresponding one of said second reference marks.

19. The compensation scale structure as claimed in claim 17, wherein said first short line segment of each of said first scale marks extends in a first oblique direction from a first direction along which said first line segment of corresponding one of said first reference marks extends, and said second short line segment of each of said second scale marks extends in a second oblique direction from a second direction along which said second line segment of corresponding one of said second reference marks extends.

20. The compensation scale structure as claimed in claim 15, wherein said printed wiring board has a plurality of said first reference marks comprising first line segments extending along two center axes perpendicular to each other of said printed wiring board, and each of said first line segments is longer than a half length of corresponding side of said printed wiring board, and also said film has a plurality of said second reference marks comprising second line segments extending along two center axes perpendicular to each other of said film, and each of said second line segments is also longer than a half length of corresponding side of said film.

21. The compensation scale structure as claimed in claim 20, wherein said first scale marks comprise first short line segments which are shorter than said first reference marks, and said first scale marks are positioned at four intermediate points of four sides of said printed wiring board, and said second scale marks comprise second short line segments which are shorter than said second reference marks, and'said second scale marks are positioned at four intermediate points of four sides of said film.

22. The compensation scale structure as claimed in claim 21, wherein said first short line segment of each of said first scale marks extends parallel to said first line segment of corresponding one of said first reference marks, and said second short line segment of each of said second scale marks extends parallel to said second line segment of corresponding one of said second reference marks.

* * * * *